United States Patent [19]

Chen et al.

[11] Patent Number: 5,066,610
[45] Date of Patent: * Nov. 19, 1991

[54] CAPPING TECHNIQUE FOR ZONE-MELTING RECRYSTALLIZATION OF INSULATED SEMICONDUCTOR FILMS

[75] Inventors: Chenson K. Chen, Weston; Bor-Yeu Tsaur, Bedford, both of Mass.

[73] Assignee: Massachusetts Institute of Technology, Cambridge, Mass.

[*] Notice: The portion of the term of this patent subsequent to Dec. 26, 2006 has been disclaimed.

[21] Appl. No.: 410,921

[22] Filed: Sep. 22, 1989

Related U.S. Application Data

[60] Division of Ser. No. 124,346, Nov. 20, 1987, Pat. No. 4,889,585, which is a continuation of Ser. No. 805,117, Dec. 4, 1985, abandoned.

[51] Int. Cl.⁵ .............................. H01L 21/20
[52] U.S. Cl. .................. 437/83; 148/DIG. 3; 148/DIG. 15; 148/DIG. 71; 148/DIG. 74; 148/DIG. 152; 148/DIG. 154; 437/174; 437/247; 437/963
[58] Field of Search ................... 148/DIG. 1, 3, 4, 15, 148/22, 25, 35, 37, 71, 74, 97, 90, 150, 152, 154, 166, 33, 33.3; 156/603, 607, 604; 427/53.1; 357/49; 437/62, 81, 82, 83, 84, 108, 109, 165, 173, 174, 233, 247, 942, 949, 954, 963, 973

[56] References Cited

U.S. PATENT DOCUMENTS

| | | | |
|---|---|---|---|
| 3,158,505 | 11/1964 | Sandor | 427/255 |
| 4,277,320 | 7/1981 | Beguwala et al. | 423/344 |
| 4,280,989 | 7/1981 | Seimiya et al. | 423/344 |
| 4,371,421 | 2/1983 | Fan et al. | 156/617 R |
| 4,435,447 | 3/1984 | Ito et al. | 427/255 |
| 4,448,632 | 5/1964 | Akasaka | 156/603 |
| 4,479,846 | 10/1984 | Smith et al. | 156/603 |
| 4,543,133 | 9/1985 | Mukai | 437/84 |
| 4,659,422 | 4/1987 | Salsurai | 156/617 R |
| 4,749,660 | 6/1988 | Short et al. | 437/83 |
| 4,752,590 | 6/1988 | Adams et al. | 437/84 |
| 4,773,964 | 9/1988 | Haond | 156/603 |
| 4,888,302 | 12/1989 | Ramesh | 437/82 |

FOREIGN PATENT DOCUMENTS

| | | | |
|---|---|---|---|
| 71731 | 2/1983 | European Pat. Off. | 156/604 |
| 0145768 | 6/1987 | Japan | 437/83 |

OTHER PUBLICATIONS

Geis et al., "Silicon Graphoepitaxy Using a Strip-Heater Oven", Appl. Phys. Lett., 37(5), Sep. 1, 1980, pp. 454–456.

Kimura et al., "Effect of Oxygen in Atmosphere . . . of Laser-Recrystallized Silicon . . .", Appl. Phys. Lett., 46(1), 1 Jan. 1985, pp. 57–59.

(List continued on next page.)

*Primary Examiner*—Olik Chaudhuri
*Assistant Examiner*—William Bunch
*Attorney, Agent, or Firm*—Fish & Richardson

[57] ABSTRACT

Wetting of encapsulated silicon-on-insulator (SOI) films during a zone-melting recrystallization (ZMR) process is enhanced by a high temperature anneal of the SOI structure in a reactive nitrogen-containing ambient to introduce nitrogen atoms to the polysilicon/silicon dioxide cap interface. The technique is not only more effective in present in cap fracture and enhancing crystal quality but is also susceptible to batch processing with noncritical parameters in a highly efficient, uniform manner. Preferably, the cap is exposed to 100% ammonia at 1100° C. for one to three hours followed by a pure oxygen purge for twenty minutes. The ammonia atmosphere is reintroduced at the same temperature for another one to three hour period before ZMR. The process is believed to result in less than a half monolayer of nitrogen at the interior cap interface thereby significantly lowering the contact angle and improving the wetting character of the SOI structure.

8 Claims, 3 Drawing Sheets

OTHER PUBLICATIONS

Geis et al., Zone-Melting Recrystallization of S. Films on Movable Strip Heater Oven, J. Electrochemic Soc., Dec. 1982, pp. 2812-2818.

Z. A. Weinberg et al., "Investigation of the Silicon Beading Phenomena during Zone-Melting Recrystallization", Appl. Phys. Lett., vol. 43, No. 12, Dec. 15, 1983.

Eli Yablonovitch et al., "Wetting Angles and Surface Tension in the Crystallization of Thin Liquid Films", J. Electrochem. Soc.: Solid-State Science and Technology, Nov. 1984, pp. 2625-2630.

C. J. Han et al., "Time-Dependent Compositional Variation in $SiO_2$ Films Nitrided in Ammonia", Apply. Phys. Lett., vol. 46, No. 7, Apr. 1, 1985.

C. K. Chen et al., "Capping Techniques for Zone-Melting-Recrystallized Si-On-Insulator Films", Mat. Res. Soc. Symp. Proc., vol. 53, pp., 53-58, 1986.

CAPPING TECHNIQUE FOR ZONE-MELTING RECRYSTALLIZATION OF INSULATED SEMICONDUCTOR FILMS

The Government has rights in this invention pursuant to contract Number F1962885-C-0002 awarded by the Department of the Air Force.

This is a division of application Ser. No. 07/124,346, filed Nov. 20, 1987, U.S. Pat. No. 4,889,583, which is a continuation of Ser. No. 06/805,117, filed Dec. 4, 1985, now abandoned.

BACKGROUND OF THE INVENTION

This invention relates generally to the conversion of amorphous or polycrystalline semiconductor materials to substantially single crystal semiconductor material by a process known as zone-melting recrystallization.

From transistors to very large scale integration of complex circuitry on a single chip, the field of solid state electronics has been built largely upon the abundant nonmetallic element silicon. Large diameter single crystal boules of silicon are sliced into wafers on which dopants, insulators and conductors are applied today using a variety of processes. Over the past few years, a major effort has been devoted to developing a new silicon-based technology involving the preparation of very thin films of pure single crystal silicon on the order of one-half micron thick, compared to the one-half millimeter thickness of typical silicon wafers. The new technology is called silicon-on-insulator (SOI) technology because the thin silicon film is supported by an insulating substrate. An efficient, reliable and economical process for producing thin film single crystal silicon has eluded researchers until now.

In comparison to device performance in bulk silicon, SOI promises significant advantages:

(1) improved speed performance in discrete devices and circuits resulting from reduced parasitic capacitance;
(2) simplified device isolation and design layout, yielding potentially higher packing densities; and
(3) radiation hard circuits for space and nuclear application.

In addition, new SOI technologies may also be utilized for three-dimensional integration of circuits.

At present, there is one mature SOI technology, silicon-on-sapphire (SOS). However, the commercial utilization of SOS has been severely limited by its high cost, relatively poor crystalline quality, and difficulty in handling and processing in comparison to bulk Si.

Recently, a new SOI technology called zone-melting recrystallization (ZMR) based on standard silicon wafers rather than sapphire crystals has exhibited the potential for displacing SOS and for utilization on a much larger scale by the semiconductor industry. The development of ZMR has been frustrated by processing problems related to the physical chemistry of the interface between the molten silicon and adjacent silicon dioxide layers which gives rise to the so-called silicon beading phenomenon during ZMR.

SOI by the ZMR technique is produced by recrystallizing a fine-grained Si film on an insulating substrate. A typical sample structure consists of a silicon wafer coated with a 1 micron thermally grown $SiO_2$ insulating layer, a half micron polycrystalline silicon (poly-Si) layer formed by low pressure chemical vapor deposition (LPCVD), topped by a 2 micron layer of CVD $SiO_2$. The last layer forms a cover to encapsulate the polysilicon film constraining it while the film is being recrystallized.

SOI by the ZMR technique is described in a paper entitled "Zone Melting Recrystallization of Silicon Film With a Movable Strip Heater Oven" by Geis et al, *J. Electrochem. Soc. Solid State Science and Technology*, Vol. 129, p. 2813, 1982.

The sample is placed on a lower graphite strip and heated to a base temperature of 1100°–1300° C. in an argon gas ambient. Silicon has a melting point of about 1410° C.; $SiO_2$ has a higher melting point, about 1710° C. Additional radiant energy is typically provided by a movable upper graphite strip heater which produces localized heating of the sample along a strip to a temperature between the two melting points. Moving like a wand, the upper heater scans the molten zone across the sample leaving a recrystallized SOI film beneath the solid $SiO_2$ cap.

One of the major problems with this procedure arises out of an interaction between the surface tension of the molten silicon and the interface with the adjacent capping and insulating $SiO_2$ layers resulting in poor wetting by the molten silicon. The silicon breaks apart and agglomerates into small beads or stripes. The resulting delamination can fracture the cap and cause defects in the crystalline structure of the silicon.

The silicon beading phenomena during ZMR is described in Weinberg al, "Investigation of the Silicon Beading Phenomena During Zone Melting Recrystallization", Applied Physics Letters 43(12) 15 December 1983, page 1105. This article also refers to the apparently beneficial effect of a silicon nitride ($Si_3N_4$) CVD overlay on top of the $SiO_2$ cap. This arrangement appeared to improve the wetting properties of the molten silicon on the silicon dioxide cap. A similar result is described in U.S. Pat. No. 4,371,421 to Fan et al entitled "Lateral Epitaxial Growth by Seeded Solidification", assigned to the assignee of the present application. The Weinberg article attributes the apparent wetting enhancement to the presence of nitrogen atoms not only in the encapsulation layers but in particular at the interface between the silicon layer and the overlying cap. Atomic nitrogen from the silicon nitride cladding probably diffuses through the 2 micron $SiO_2$ cap to the poly-Si/-cap interface and promotes wetting of the molten silicon on the $SiO_2$ surface. However, problems with uniformity and reproducibility have arisen because of difficulty in controlling deposition of the nitride layer by CVD or by sputtering. Moreover, at best, this cladding technique does not readily lend itself to high volume simultaneous mass production or batch processing.

SUMMARY OF THE INVENTION

Accordingly, the general purpose of the present invention is to introduce the right amount of nitrogen to the poly-Si/$SiO_2$ cap interface in a uniform, controlled fashion to improve wetting for encapsulated SOI films undergoing ZMR. Instead of using a nitride cladding layer, the $SiO_2$ cap is exposed to a high temperature anneal in a reactive nitrogen-containing ambient. Annealing the capped SOI in ammonia ($NH_3$) with an intermediate oxidation step yields excellent wetting properties during ZMR. A wide range of process parameters is effective. The preferred anneal consists of:

(1) 1–3 hours in 100% $NH_3$;
(2) 20 minutes in $O_2$; and
(3) 1–3 hours in 100% $NH_3$, all at 1100° C. The oxygen anneal appears to shorten the annealing time by enabling more nitrogen to reach the interface more quickly. A further variation on this process is to use an intermediate annealing step following deposition of a portion of the cap, i.e., to a partial depth (e.g., 0.2 micron) followed by deposition of the remainder of the cap to the full depth (e.g., 2 microns). The $NH_3$ anneal produces better ZMR samples and can be performed as a batch process.

DETAILED DESCRIPTION

The following description generally relates to silicon semiconductors. While silicon is by far the most important semiconductor material in use today, the invention is applicable by analogy in the epitaxial growth of other semiconductor materials such as gallium arsenide and germanium.

Figure 1:
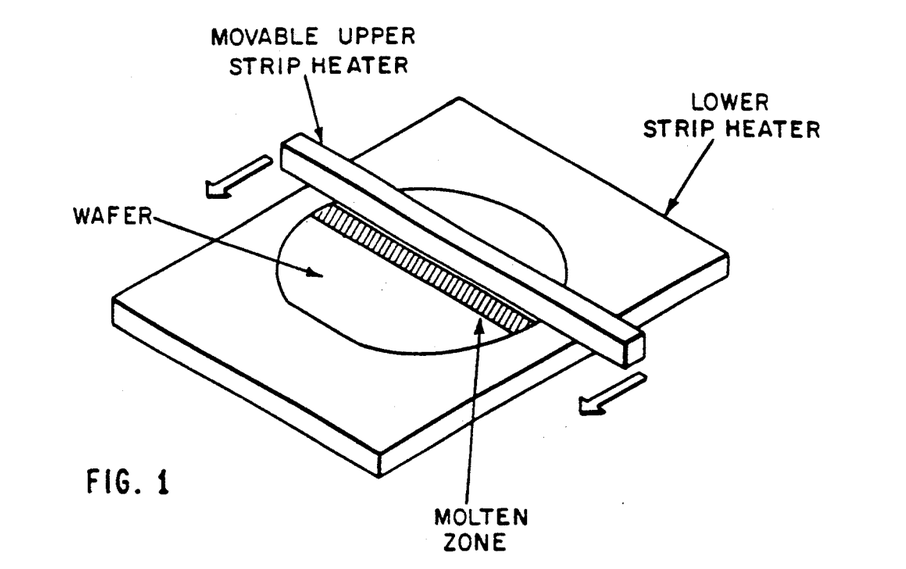
FIG. 1 is a schematic isometric view of an encapsulated SOI wafer undergoing ZMR.

FIG. 1 illustrates the thermal components of a typical ZMR apparatus, namely, the stationary lower strip heater and the movable upper strip heater. The lower strip heater is formed by a thin rectangular plate of graphite. Opposite ends of the strip heater are connected in circuit to a source of electrical current in order to achieve controlled heating of a single wafer with formed SOI structure. The movable upper heater typically comprises an elongated graphite strip with a square cross-section of about 1 sq mm in area. The length of the upper heater more than spans the wafer and is oriented parallel to the reference face of the wafer spaced about 1 mm above the wafer surface. The ends of the upper heater are connected in an electrical circuit for resistive heating.

Figure 2:
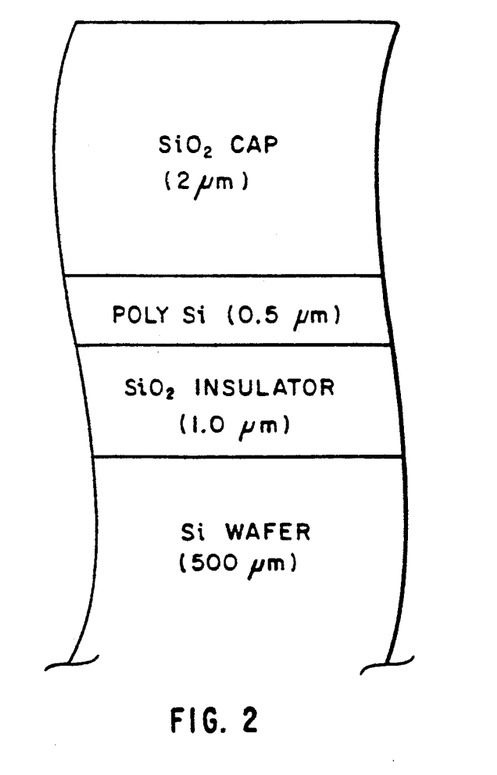
FIG. 2 is a schematic diagram of the cross-section of a typical SOI structure.

The layers of an encapsulated SOI wafer are diagramed in cross-section in FIG. 2. A typical sample consists of a silicon wafer coated with a 1 micron thermally grown $SiO_2$ layer, a 0.5 micron poly-Si layer formed by LPCVD, topped by a 2 micron layer of CVD $SiO_2$. Prior to the present process development, an additional 30 nm cladding layer Si-rich $Si_3N_4$ was deposited by RF sputtering or CVD on top of the $SiO_2$ cap to promote wetting of the molten Si film on $SiO_2$ during ZMR. The otherwise useless nitride layer is obviated by the present invention.

The wafer of FIG. 2 is placed cap-side-up on the lower strip heater (FIG. 1). The sample is heated to a base temperature of 1100°-1300° C., typically in an Argon gas ambient. The upper heater is heated to about 2200° C. The strip-like zone beneath the rod is heated to a temperature just above the poly-Si melting point, e.g., 1430° C., well below the melting point of $SiO_2$, thus melting the polysilicon in a band beneath the solid $SiO_2$ cap. As the upper heater moves across the face of the wafer, the molten zone is scanned across the sample leaving behind a recrystallized SOI film. In this manner, the polycrystalline silicon layer is converted to a single crystal layer suitable for semiconductor devices.

The interaction between the surface of the molten silicon and the adjacent $SiO_2$ surfaces involves a property known as wetting. Water, for example, beads up on a hydrophobic surface like wax due to poor wetting. The angle formed between the outer skin of a liquid droplet and the solid surface is called the wetting angle or contact angle. For water, for example, the more hydrophobic the surface, the higher the contact angle. The contact angle of mercury on glass, for example, is so high (greater than 90°) that a convex miniscus is formed at the top of a mercury column in a glass tube. For silicon, like other materials, the contact angle is not solely a function of the molten material but is affected by the nature of the solid $SiO_2$ surface as well. Molten silicon on silicon dioxide exhibits a high contact angle, nominally, 87°, characteristic of high beading potential. In contrast, molten silicon on silicon nitride ($Si_3N_4$) exhibits a low contact angle of about 25°. A description of the physical chemistry which accounts for this difference in contact angle is beyond the scope of this discussion although it appears that the lower surface energy of the nitride enables the molten silicon to wet the nitride surface better. That is, silicon beads up less on nitride than on silicon dioxide. Analysis has shown that wetting of molten Si in the SOI structure is best for small contact angles, i.e., much less than 90°. The molten Si is susceptible to beading or agglomeration as the contact angle approaches or exceeds 90°.

During ZMR of encapsulated SOI films, beading up of the molten silicon at the $SiO_2$ cap interferes with recrystallization and causes stress fractures in the cap itself. Either type of defect is unacceptable in that it destroys the uniformity of the single crystal silicon.

It is believed that nitrogen atoms in the nitride cladding layer used in the past diffused through the 2 micron CVD $SiO_2$ cap to the interface with poly-Si. The presence of nitrogen at the interface apparently promoted wetting of the molten silicon on the $SiO_2$ cap by lowering the contact angle.

Figure 3:
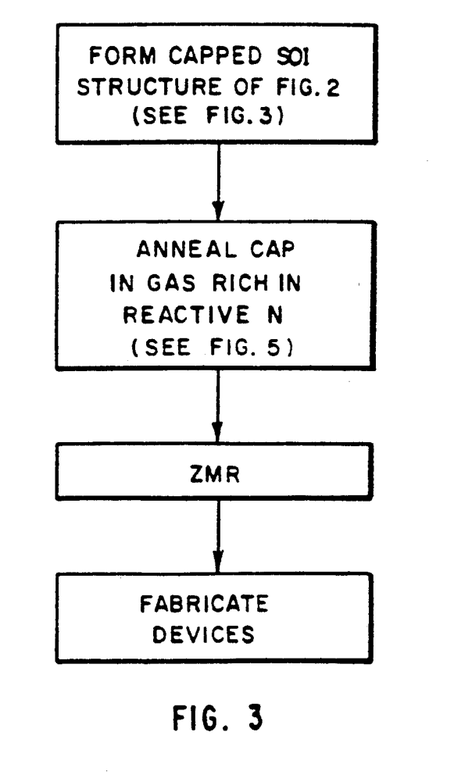
FIG. 3 is an overall process flow diagram.

As shown in FIG. 3, the present invention represents a better technique for introducing an appropriate amount of nitrogen to the poly-Si/CVD $SiO_2$ cap interface in a uniform, controlled fashion resulting in improved SOI films after ZMR. The capped SOI structure of FIG. 2 with no nitride cladding is annealed before ZMR at a temperature substantially below the melting point of silicon in an atmosphere rich in reactive nitrogen. A wide range of process parameters are effective, however, a 100% $NH_3$ atmosphere at 1100° appears to work best. At this temperature, the gas decomposes sufficiently at the $SiO_2$ surface allowing nitrogen atoms to diffuse through the $SiO_2$ cap. The cap/silicon interface appears to have an affinity for nitrogen atoms. After the high temperature anneal, a concentration of nitrogen exists at the interface with a concomitant improvement in wetting properties. After annealing, the treated wafer is inserted in the heating apparatus of FIG. 1 for ZMR of the silicon. Because of the lowered contact angle at the $Si/SiO_2$ cap boundary, beading or stripping of the molten silicon is suppressed and stress on the cap is thereby sufficiently diminished to leave the cap intact. If too much N is present at the Si/SiO$_2$ cap boundary, although wetting is excellent, ZMR results in poor crystal quality of the SOI film.

Figure 4:
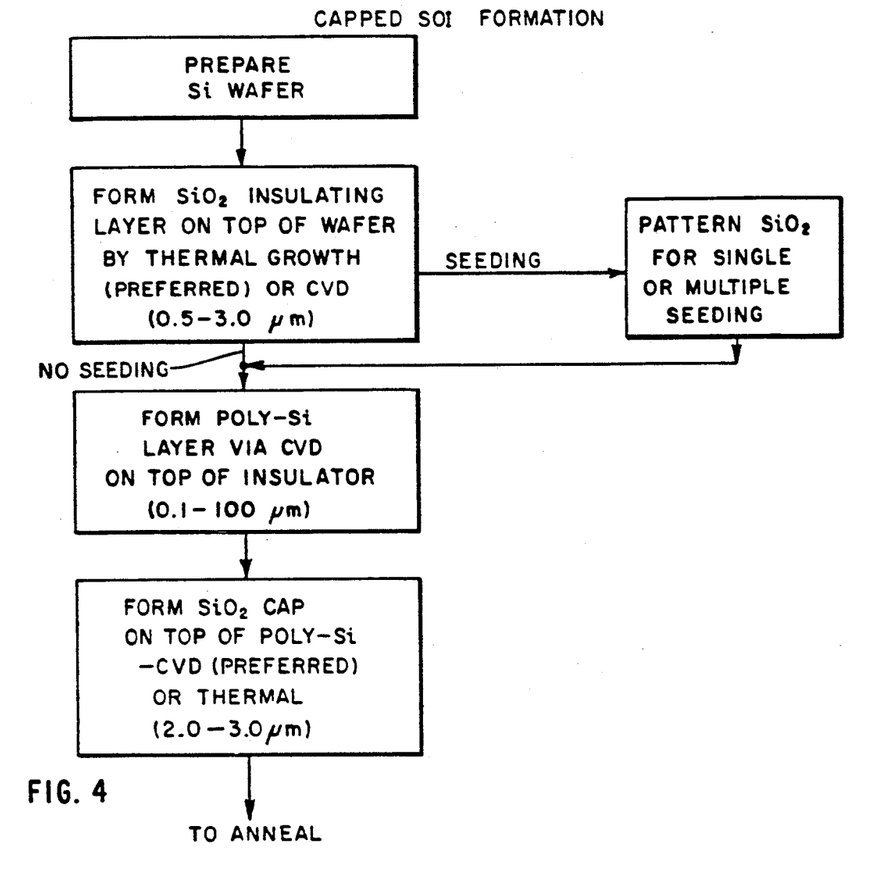
FIG. 4 is a detailed process flow diagram for the capped SOI forming step of FIG. 3.
Figure 5:
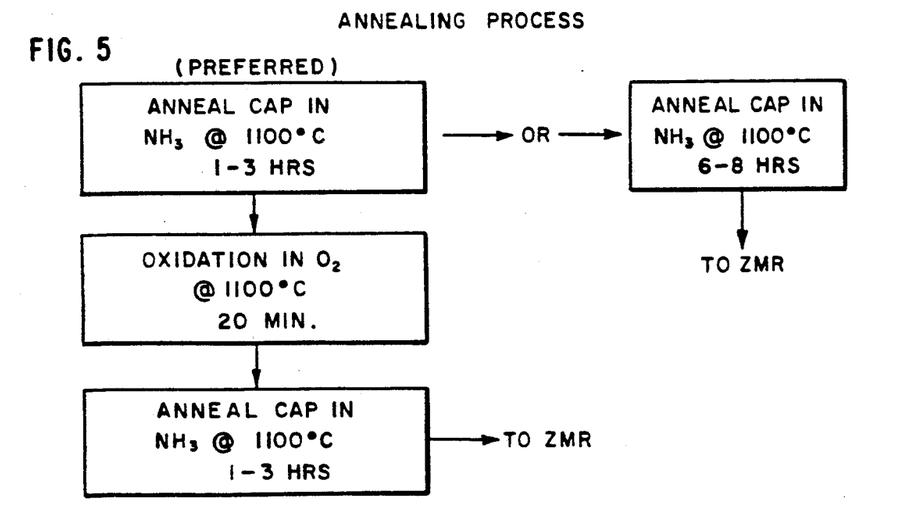
FIG. 5 is a detailed process flow diagram for the annealing step of FIG. 3.

The process is described in more detail in FIGS. 4 and 5. Forming the encapsulated SOI structure begins with preparing a standard 3-inch silicon wafer typically 500 microns thick. The insulating layer is formed by growing SiO$_2$ thermally or by CVD on top of the wafer to a depth of 0.5 to 3.0 microns. If desired, before applying the next layer, a seeding pattern can be created as described in U.S. Pat. No. 4,371,421. Then, the polysilicon layer is formed via LPCVD on top of the insulating layer in a thin film from 0.1 to 100 microns (preferably, 0.5 micron). Over the poly-Si layer the silicon dioxide cap is formed preferably by CVD or grown thermally (like the insulating layer) to a thickness of from 2.0 to 3.0 microns. The layered wafer then proceeds to the annealing process as shown in FIG. 5.

Two different pre-ZMR annealing processes are shown in FIG. 5, the preferred one involving annealing the SOI structure in NH$_3$ with an intermediate oxidation step. In particular, the better method consists of exposing the cap side of the SOI structure for:

(1) 1-3 hours in 100% NH$_3$;
(2) 20 minutes in O$_2$; and
(3) 1-3 hours in 100% NH$_3$;
all at 1100° C.

Figure 6:
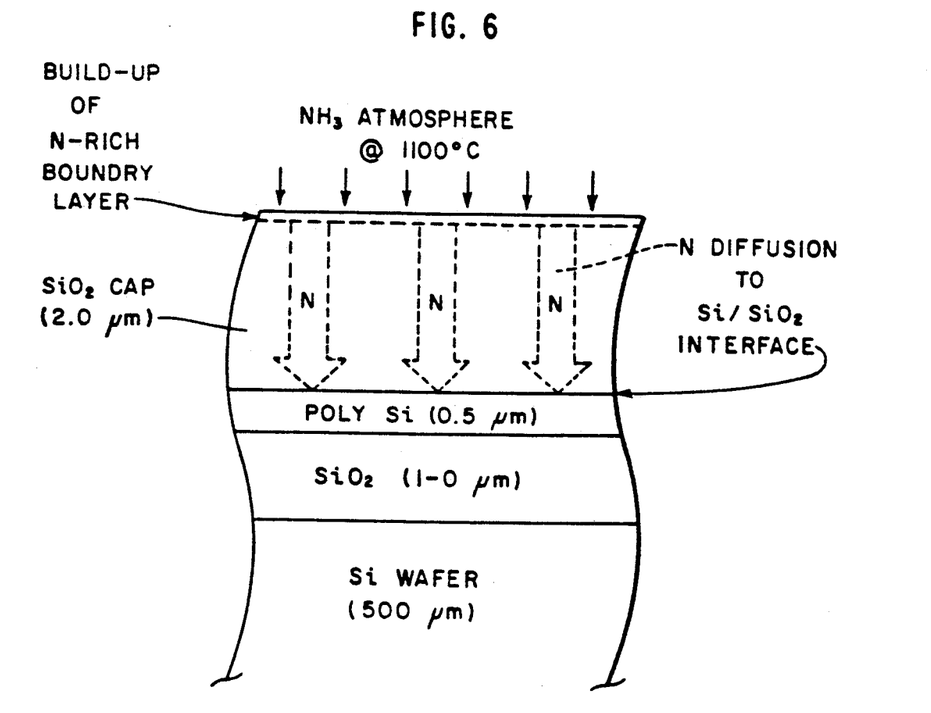
FIG. 6 is a schematic diagram of the SOI structure in cross-section illustrating the diffusion of nitrogen to the $Si/SiO_2$ cap interface in the annealing atmosphere.

Interruption of the NH$_3$ anneal with a short oxidation yields SOI structures with excellent wetting properties. During the initial NH$_3$ exposure, nitrogen is incorporated into the SiO$_2$ cap, with peak nitrogen accumulation at both surfaces, that is, the exterior and interior surface of the cap. It is believed that accumulation of nitrogen at the exterior gas interface of the cap progressively inhibits further rapid incorporation of nitrogen at the interior poly-Si interface. To eliminate this surface nitrogen-rich boundary layer (FIG. 6), the sample is briefly oxidized followed by an additional anneal in NH$_3$. Multiple NH$_3$ anneals with intervening oxidation have been found to be more effective than a single uninterrupted eight-hour 100% NH$_3$ anneal as shown in the alternative process of FIG. 5 in promoting wetting of the SOI film.

Alternatively, an NH$_3$ anneal can be carried out before all of the thickness of the cap is deposited. That is, the cap can be deposited in two or more steps with intervening anneals.

After deposition of the poly-Si layer and a thinner CVD SiO$_2$ layer 500 A to 10,000 A thick, a single anneal in 100% NH$_3$ or NH$_3$ in N$_2$, followed by additional CVD SiO$_2$ to a total thickness of 2.0 microns yields samples with excellent wetting characteristics during ZMR.

After deposition of the Si layer, we annealed in 4% NH$_3$ and then deposited the cap. Although wetting was excellent, crystal quality was poor presumably because of too much N at the interface. By reducing the amount of N introduced, either by reducing annealing temperature annealing time or NH$_3$ partial pressure, the amount of N can be adjusted to achieve good crystal quality as well as wetting. It is believed that this anneal introduced N to the native oxide on the polysilicon film.

With even higher annealing temperatures (1100°-1400° C.) it may be possible to introduce sufficient nitrogen into the two micron SiO$_2$ cap without the intermediate oxidation step. It has been found, however, that a high temperature anneal of the SOI structure in a relatively unreactive gas N$_2$, does not produce samples which wet well during ZMR. It is believed that other nitrogen containing compounds, possibly alkylamines, which decompose at the SiO$_2$ surface at elevated temperatures may also be effective in introducing sufficient nitrogen into the SiO$_2$ capping layer.

Auger spectroscopy of good samples annealed according to the invention indicate that far less than a full monolayer of nitrogen is present at the interface between the SiO$_2$ cap and the poly-Si film. The sensitivity of the Auger spectroscopy instrument used was one-half monolayer at the Si/capping SiO$_2$ interface. The instrument gave no reading for a nitrogen layer thus indicating that less than one-half monolayer of nitrogen atoms was present at the interface.

EXAMPLE I

An encapsulated SOI was formed having a one-half micron polysilicon layer topped with a 2.0 micron SiO$_2$ cap. Prior to ZMR the sample was annealed for one hour in 100% NH$_3$, oxidized in O$_2$ for twenty minutes and annealed for another hour in 100% NH$_3$ ambient all at 1100° C. The cap was observed to be intact after ZMR and the recrystallized silicon film was observed to have good crystal quality on gross inspection.

EXAMPLE II

In this experiment, all parameters were the same as Example I except that the annealing time in NH$_3$ is extended to three hours both before and after the intervening oxidation step. After ZMR, the sample was inspected and the cap found to be intact. Marginally better crystal quality than that in Example I was observed.

EXAMPLE III

Five samples were prepared in accordance with FIG. 2 and subjected to pure NH$_3$ anneals for one, two, three, four and eight hours, respectively, without the intermediate oxidation step. The results were moderately successful, however, not qualitatively as good as in Example I or II. In particular, there was a slight tendency of beading of the silicon film during ZMR.

EXAMPLE IV

Figure 7:
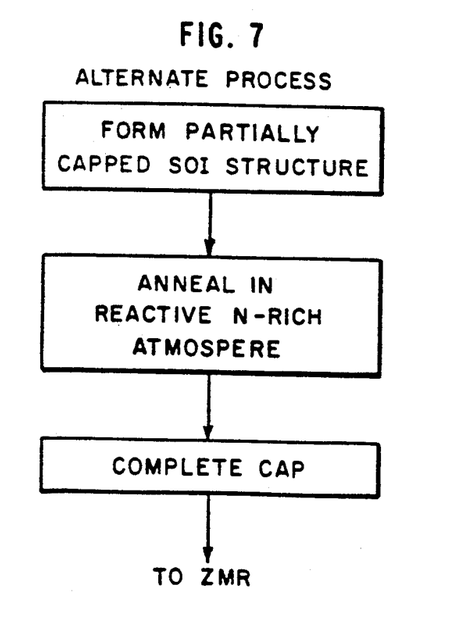
FIG. 7 is a process flow diagram of an alternate technique involving formation of the cap in steps with an intervening $NH_3$ anneal.
Figure 8:
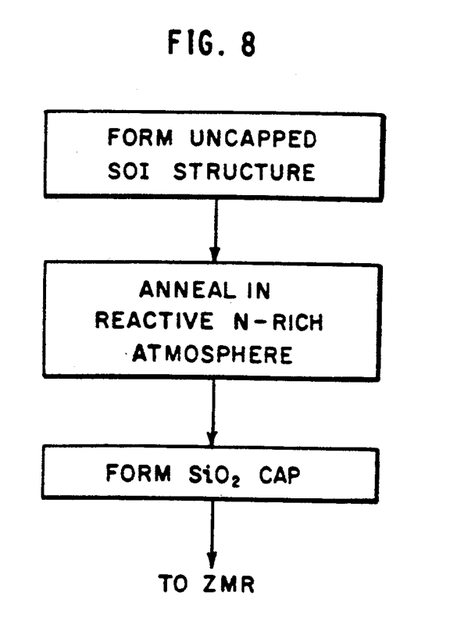
FIG. 8 is a process flow diagram of an alternate technique involving the $NH_3$ anneal before forming the cap.

To test the partial cap anneal technique of FIG. 7, samples with the following initial cap thicknesses were prepared, annealed and finished prior to ZMR in accordance with the following table:

| Initial Cap Thickness (Micron) | Anneal Time (Hours) | Final Cap Thickness (Micron) |
|---|---|---|
| 0.2 | 4 | 2.0 |
| 0.2 | 8 | 2.0 |
| 0.5 | 4 | 1.5 |
| 0.5 | 8 | 1.5 |
| 1.0 | 4 | 2.0 |
| 1.0 | 8 | 2.0 |

Identical sample pairs were annealed for four and eight hours respectively. The oxidation step was not used. Following ZMR, each sample was inspected and found to have a good cap and good crystal quality.

EXAMPLE V

A sample wafer was prepared in accordance with FIG. 2 except that the cap thickness was reduced to 500 Angstroms. The thinly capped SOI was subjected to a 4% NH$_3$ atmosphere for thirty minutes at 1100°. The remainder of the thickness of the SiO2 cap was deposited to a full thickness of 2.0 microns before undergoing ZMR. Excellent results were obtained.

EXAMPLE VI

A sample was prepared in accordance with FIG. 2, except that before depositing the SiO2 capping layer, the poly-Si layer was exposed to a 4% NH3 anneal at 1100° C. The sample had excellent wetting characteristics but much nitrogen was incorporated into the silicon layer too, resulting in poor crystal quality upon ZMR.

EXAMPLE VII

A sample prepared in accordance with FIG. 2 was subjected to a high temperature anneal in a nitrogen gas (N2) with no improvement in the wetting characteristics during ZMR. The resulting beading degraded the crystal quality and overstressed the cap. It was concluded that N2 did not decompose at 1100° C. sufficiently to allow nitrogen atoms to diffuse to the interface. It was concluded that a gas is required which sufficiently decomposes well below the semiconductor melting point to release the reactive element, here N atoms.

The advantages of the foregoing annealing processes are important in terms of future commercial exploitation of SOI technology. The reactive nitrogen annealing process has relatively noncritical process parameters and can be performed as a batch process permitting a large throughput at low cost producing a much more uniform distribution of nitrogen than the existing technique of sputtered or CVD silicon nitride cladding with better properties and reproducibility.

The foregoing description of specific process parameters and materials is intended to be illustrative rather than restrictive. Many variations, additions, omissions or rearrangements with respect to the specific processes described herein are, of course, possible without departing from the spirit and principle of the invention. For example, while ammonia is preferred, other reactive nitrogen bearing gases may be used. While the foregoing examples were carried out at atmospheric pressure, different pressures will also work. In addition, while nitrogen appears to be beneficial with silicon, other elements which have a similar effect on wetting characteristics may be applied via the same process. Moreover, while silicon is by far the most important application known at present, other semiconductor material such as germanium and galium arsenide can be treated in a similar manner.

The temperature and duration of the anneal can be varied depending on the permeability (density) and thickness of the capping layer. The maximum temperature of 1250° C. attainable by conventional furnaces should be more than adequate.

The intermediate oxdiation step can be employed more than once and can be used in combination with the multistage cap formation system of FIG. 7. The process described herein, of course, is not restricted to any particular type of ZMR apparatus; other conventional means exist for generating a travelling molten zone besides those described and shown in FIG. 1 in this application. In any case, the scope of the invention is defined not by the specific processes disclosed herein but by the appended claims and equivalents thereto.

What is claimed is:

1. A method of forming an encapsulated insulated semiconductor film structure, comprising
   forming an insulating layer on a substrate,
   forming a semiconductor layer of amorphous or polycrystalline silicon on top of said insulating layer to form a silicon on insulator structure,
   providing an atmosphere consisting essentially of inerts and a noninert gas, stable at ambient temperature, which is a source of a reactive material whose presence promotes wetting of molten silicon on silicon dioxide, said noninert gas decomposing below the melting point of silicon to release said reactive material,
   annealing said structure in said atmosphere at a temperature below the melting point of silicon but high enough to decompose said gas so as to release said reactive material to deliver sufficient quantities of said reactive material to the surface of said structure to avoid agglomeration of the resulting semiconductor film,
   forming a capping layer of silicon dioxide covering a substantial portion of said semiconductor layer, said reactive material being present at the interface, and
   subjecting the annealed structure of the preceding steps to zone-melting recrystallization.

2. The method of claim 1, wherein said reactive element is nitrogen.

3. The method of claim 1, wherein the semiconductor material is silicon.

4. The method of claim 1, wherein said ambient gas contains NH3.

5. The method of claim 4, wherein said ambient gas contains less than 4% NH3.

6. A method of making an encapsulated silicon on insulator structure, comprising
   forming an encapsulated silicon on insulator structure having a silicon dioxide cap over an amorphous or polycrystalline silicon film, with a quantity of a reactive material whose presence promotes wetting of molten silicon on silicon dioxide at the interface of the cap and film to avoid agglomeration of the film, due to zone-melting recrystallization, by subjecting said structure, during formation before zone-melting recrystallization, to an annealing atmosphere consisting essentially of inerts and a noninert gas, stable at ambient temperature, which is a source of said reactive material, said atmosphere being heated to a temperature below the melting point of silicon but sufficiently high to cause the noninert gas to decompose and release said reactive material in nascent, unbound form, and
   subjecting the resulting structure to zone-melting recrystallization.

7. A method of forming an encapsulated insulated semiconductor film structure, comprising
   forming a first layer of insulating material on a substrate,
   forming a second layer of amorphous or polycrystalline silicon,
   forming a third layer of silicon dioxide to form a silicon dioxide capped silicon on insulator structure,
   providing an atmosphere consisting essentially of inerts and a noninert gas, stable at ambient temperature, which is a source of a reactive material whose presence promotes wetting of molten silicon on silicon dioxide, said noninert gas decomposing below the melting point of silicon to release said reactive material, annealing said structure in said atmosphere at a temperature below the melting point of silicon but high enough to decompose said gas so as to release said reactive material for a sufficient length of time to diffuse quantities of said reactive material through the third layer to the interface with the second layer in an amount sufficient to avoid agglomeration of the resulting semiconductor film, and subjecting the annealed structure resulting from the preceding steps to zone melting recrystallization.

8. A method of forming an encapsulated insulated semiconductor film body, comprising forming an insulating layer on a substrate, forming a semiconductor layer of amorphous or polycrystalline silicon on top of the insulating layer, forming a capping layer of silicon dioxide on top of the semiconductor layer to a partial thickness to form a silicon dioxide capped silicon on insulator structure, providing an atmosphere consisting essentially of inerts and a noninert gas, stable at ambient temperature, which is a source of a reactive material whose presence promotes wetting of molten silicon on silicon dioxide, said noninert gas decomposing below the melting point of silicon to release said reactive material, annealing said structure in said atmosphere at a temperature below the melting point of silicon but high enough to decompose said gas so as to release said reactive material for a length of time sufficient for the reactive material to diffuse through the partial thickness of the capping layer to the interface with the semiconductor layer to avoid agglomeration of the resulting semiconductor film, increasing the thickness of the capping layer by forming an additional integral layer of the same material, and subjecting the structure formed by the preceding steps to zone-melting recrystallization.

* * * * *

UNITED STATES PATENT AND TRADEMARK OFFICE
CERTIFICATE OF CORRECTION

PATENT NO. : 5,066,610

DATED : November 19, 1991

INVENTOR(S) : Chenson K. Chen et al.

It is certified that error appears in the above-identified patent and that said Letters Patent is hereby corrected as shown below:

In the Abstract, line 7, "present in" should be --preventing--.

Col. 1, line 4, "07,124,346" should be --07/124,346--.

Add claim 9:

--9. The method of claim 7, wherein said annealing step is performed in two stages with an intervening oxidation step.--

Signed and Sealed this

Third Day of August, 1993

Attest:

MICHAEL K. KIRK

Attesting Officer

Acting Commissioner of Patents and Trademarks